US009407486B2

(12) United States Patent
Chang et al.

(10) Patent No.: US 9,407,486 B2
(45) Date of Patent: Aug. 2, 2016

(54) METHOD AND APPARATUS FOR GENERATING SIGNAL IN WIRELESS COMMUNICATION SYSTEM

(71) Applicant: Electronics and Telecommunications Research Institute, Daejeon (KR)

(72) Inventors: Kapseok Chang, Daejeon (KR); Byung-Jae Kwak, Daejeon (KR)

(73) Assignee: Electronics and Telecommunications Research Instit, Daejeon (KR)

( * ) Notice: Subject to any disclaimer, the term of this patent is extended or adjusted under 35 U.S.C. 154(b) by 0 days.

(21) Appl. No.: 14/645,099

(22) Filed: Mar. 11, 2015

(65) Prior Publication Data
US 2015/0263875 A1    Sep. 17, 2015

(30) Foreign Application Priority Data

Mar. 11, 2014 (KR) .................. 10-2014-0028085
May 2, 2014  (KR) .................. 10-2014-0053549
Mar. 3, 2015 (KR) .................. 10-2015-0029981

(51) Int. Cl.
| H04K 1/10  | (2006.01) |
| H04L 27/28 | (2006.01) |
| H04L 27/26 | (2006.01) |
| H04W 56/00 | (2009.01) |
| H04L 27/20 | (2006.01) |
| H04B 1/04  | (2006.01) |

(52) U.S. Cl.
CPC .............. *H04L 27/2621* (2013.01); *H04B 1/04* (2013.01); *H04L 27/20* (2013.01); *H04W 56/001* (2013.01); *H04B 2001/045* (2013.01)

(58) Field of Classification Search
CPC . H04L 27/2621; H04L 27/20; H04W 56/001; H04B 1/04; H04B 2001/045
USPC .......................................... 375/260, 296, 346
See application file for complete search history.

(56) References Cited

U.S. PATENT DOCUMENTS

| 2007/0189406 A1* | 8/2007 | Kim .................... H04L 27/2613 375/260 |
| 2011/0058528 A1 | 3/2011 | Chang et al. |
| 2012/0219077 A1 | 8/2012 | Chang et al. |

FOREIGN PATENT DOCUMENTS

KR    1020080038265 A    5/2008

OTHER PUBLICATIONS

Part 11: Wireless LAN medium access control (MAC) and physical layer (PHY) specification, 2012, IEEE Computer Society, IEEE Std 802.11.
K. Chang et al., Robust replica correlation-based symbol synchronisation in OFDM systems, Electronics Letters, Aug. 2008, pp. 1024-1025, vol. 44, No. 17.
Kapseok Chang et al., Signal design for reduced complexity and accurate cell search/synchronization in OFDM-based cellular systems, IEEE Transactions on Vehicular Technology, pp. 4170-4175, Nov. 2012, vol. 61, No. 9.

(Continued)

*Primary Examiner* — Phuong Phu
(74) *Attorney, Agent, or Firm* — William Park & Associates Ltd.

(57) ABSTRACT

A method and apparatus for generating a signal in a wireless communication system by allocating a sequence to a plurality of subcarriers for sending the signal and generating the signal based on the sequence and a phase rotation sequence are provided.

18 Claims, 15 Drawing Sheets

(56) References Cited

OTHER PUBLICATIONS

Kapseok Chang et al., ETRI Technical PHY proposal for IEEE 802.15 TG8 PAC Standard, Jul. 2013, IEEE P802.15-13-0373-01-0008.

Kapseok Chang et al., Collision Detection Based PHY Proposal for PAC, Mar. 2014, IEEE 802.15-14-0132-00-0008.

Kapseok Chang et al., Samsung-ETRI Merged MAC proposal to TG8 CFC, May 2014, IEEE 802.15-14-0254-00-0008.

Byung-Jae Kwak et al., Performance Evaluation of Fully Distributed Synchronization Mechanism for PAC, May 2014, IEEE 802.15-14-0249-00-0008.

Kapseok Chang et al., ETRI PHY Proposal for PAC, May 2014, IEEE P802.15-14-0250-01-0008.

Myung Jong Lee, TG8 Closing Report, May 2014, IEEE 15-14-330-00-0008.

Marco Hernandez, Wireless Personal Area Networks, Nov. 2014, IEEE P802.15-14-0696-01-0008.

Myung Jong Lee, TG8 Closing Report, Nov. 2014, IEEE 15-14-0683-00-0008.

Kapseok Chang et al., Harmonized PHY Proposal from ETRI and NICT, Nov. 2014, IEEE P802 15-14-0635-00-0008.

\* cited by examiner

METHOD AND APPARATUS FOR GENERATING SIGNAL IN WIRELESS COMMUNICATION SYSTEM

CROSS-REFERENCE TO RELATED APPLICATION

This application claims priority to and the benefit of Korean Patent Application Nos. 10-2014-0028085, 10-2014-0053549 and 10-2015-0029981 filed in the Korean Intellectual Property Office on Mar. 11, 2014, May 2, 2014, and Mar. 3, 2015, the entire contents of which are incorporated herein by reference.

BACKGROUND OF THE INVENTION (a) Field of the Invention

The present invention relates to a method and apparatus for generating a signal in a wireless communication system.

(b) Description of the Related Art

A terminal may initially access a wireless communication system, may obtain synchronization, and may demodulate system information, control information, and data information. In this case, sync estimation performance and demodulation performance of the terminal are important indexes that determine the excellence of a system. Accordingly, it is important to efficiently design the sync signal and information signal of a wireless communication system.

In a conventional system for sending information through frequency resources, the sender side allocates a base sequence (i.e., a binary sequence or complex sequence) for synchronization acquisition to available frequency resources and sends a sync signal. Furthermore, the receiver side measures a correlation between the time domain signal of a previously known sync signal and the time domain signal of a received signal and considers sampling timing having the greatest correlation value to be a synch point. However, a conventional method of obtaining synchronization is disadvantageous in that performance is low in an environment in which a frequency offset is great. In order to overcome the disadvantage, the sender side may allocate a specific base sequence to half the available frequency resources, may modify the specific base sequence, may allocate the modified sequence to the other half, and may send a sync signal. However, such a synchronization acquisition method cannot greatly lower a peak to average power ratio (PAPR) due to its inherent limit.

Although the receiver side has accurately obtained synchronization, it must be able to properly demodulate system information, control information, or data information. Accordingly, the receiver side must be able to obtain a diversity gain even in a fading channel and to lower the PAPR. A technology for lowering the PAPR must be able to be applied to all the transmission signals because it may help in reducing the cost of an amplifier that may be mounted on a terminal. The reason for this is that if any one of transmission signals has a high PAPR, the receiver side must use an expensive amplifier in order to prevent inherent distortion attributable to the signal having the high PAPR, thereby increasing the amplifier cost.

SUMMARY OF THE INVENTION

The present invention has been made in an effort to provide a method and apparatus for generating a signal in a wireless communication system having advantages of having excellent performance in an environment in which a frequency offset is great and reducing the PAPR.

In accordance with an exemplary embodiment of the present invention, a sync signal that is robust against a frequency offset and is capable of reducing the PAPR can be generated using a phase rotation sequence. Furthermore, an information signal having excellent demodulation performance and that is capable of reducing the PAPR can be generated through a diversity gain.

DETAILED DESCRIPTION OF THE EMBODIMENTS

Figure 1:
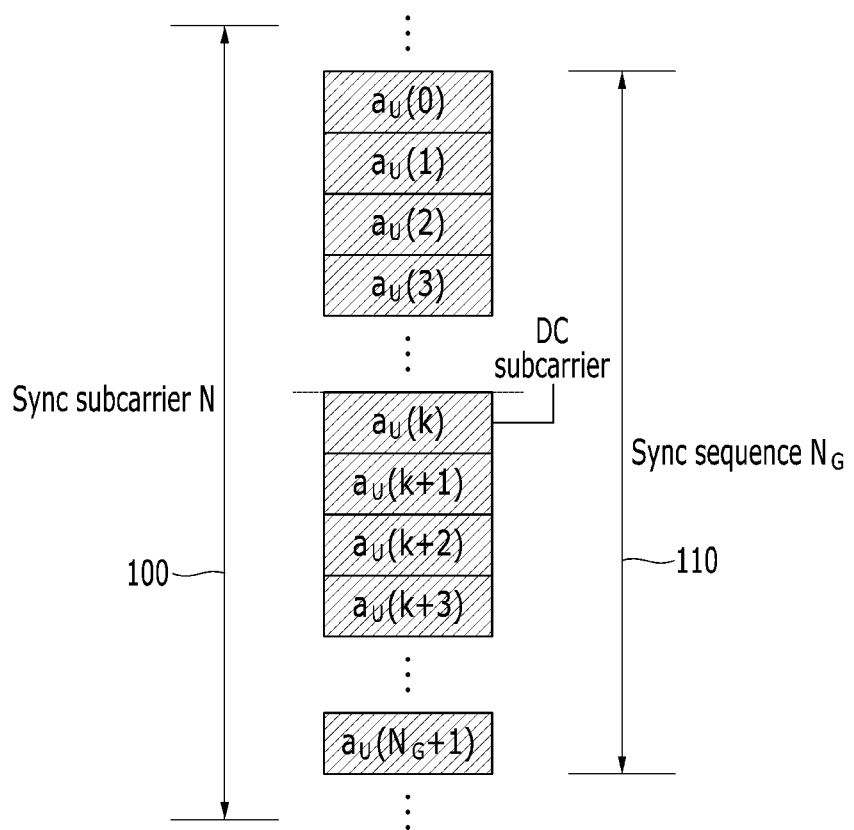
FIGS. 1 and 2 are conceptual diagrams illustrating a method of generating a sync signal in accordance with an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In the entire specification, a mobile station (MS) may refer to a terminal, a mobile terminal (MT), an advanced mobile station (AMS), a high reliability mobile station (HR-MS), a subscriber station (SS), a portable subscriber station (PSS), an access terminal (AT)), or user equipment (UE), and may include some or all of the functions of the MT, MS, AMS, HR-MS, SS, PSS, AT, and UE.

Furthermore, a base station (BS) may refer to an advanced base station (ABS), a high reliability base station (HR-BS), a nodeB, an evolved node B (eNodeB), an access point (AP), a radio access station (RAS), a base transceiver station (BTS), a mobile multihop relay (MMR)-BS, a relay station (RS) functioning as a base station, a relay node (RN) functioning as a base station, an advanced relay station (ARS) functioning as a base station, a high reliability relay station (HR-RS) functioning as a base station, or a small base station [e.g., a femto BS, a home node B (HNB), a home eNodeB (HeNB), a pico BS, a metro BS, or a micro BS], and may include some or all of the functions of the ABS, nodeB, eNodeB, AP, RAS, BTS, MMR-BS, RS, RN, ARS, HR-RS, and small base station.

Figure 2:
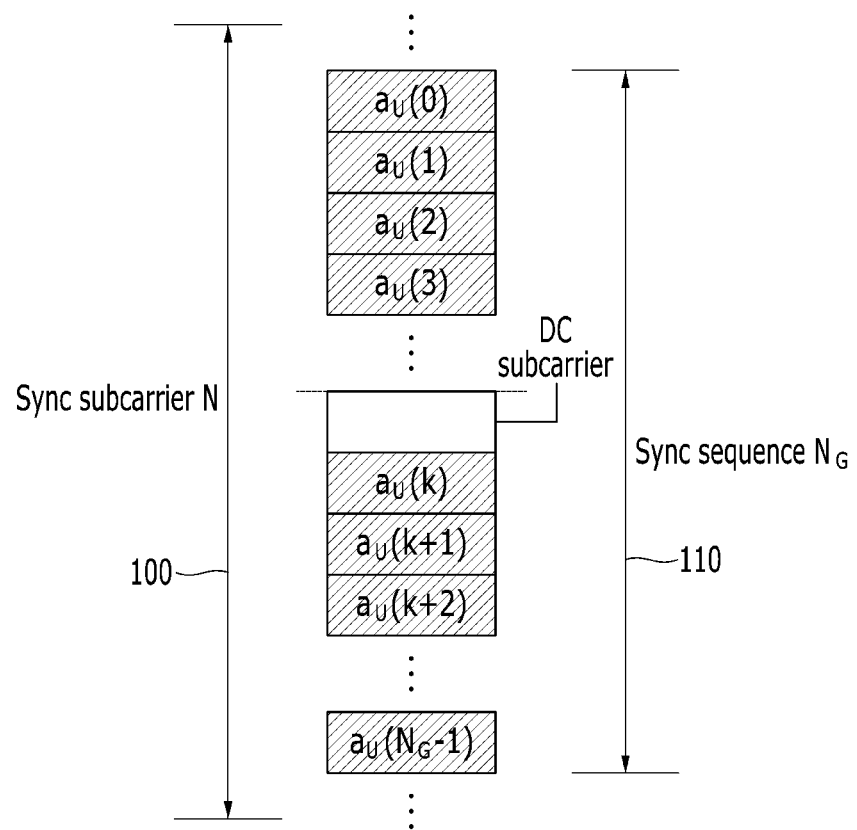

FIGS. 1 and 2 are conceptual diagrams illustrating a method of generating a sync signal in accordance with an exemplary embodiment of the present invention.

Referring to FIGS. 1 and 2, N is a total number of frequency resources (i.e., subcarriers for sending synchronization, which are hereinafter called "sync subcarriers") 100 that may be used to send a sync signal, and $a_u(k)$ is a sequence 110 allocated to part of the sync subcarrier. The sequence 110 allocated to part of the sync subcarrier 100 is a binary sequence or a complex sequence. In an embodiment of the present invention, $a_u(k)$ denotes a complex sequence, but the present invention is not limited thereto. Equation 1 is a Zadoff-Chu (ZC) sequence, that is, a complex sequence.

$$a_U(k) = e^{-j\frac{\pi U k(k+1)}{N_G}}, k = 0, 1, \ldots, N_G - 1 \quad \text{(Equation 1)}$$

In Equation 1, k is the index of a sequence element (or subcarrier), U is the index of the sequence, $N_G$ is the length of the sequence $a_u(k)$. A sequence element is allocated to a DC subcarrier illustrated in FIG. 1 (in this case, the DC subcarrier may be nulled), and a sequence element is not allocated to a DC subcarrier illustrated in FIG. 2. A sequence illustrated in FIGS. 3 to 13 in accordance with exemplary embodiments of the present invention may be allocated to a DC subcarrier, and an exemplary embodiment of the present invention is not limited thereto. When the sync sequence 110 is allocated to some subcarriers of the sync subcarrier 100 using the methods illustrated in FIGS. 1 and 2 and a sync signal is sent, sync estimation performance may be deteriorated if a frequency offset is severe.

Figure 3:
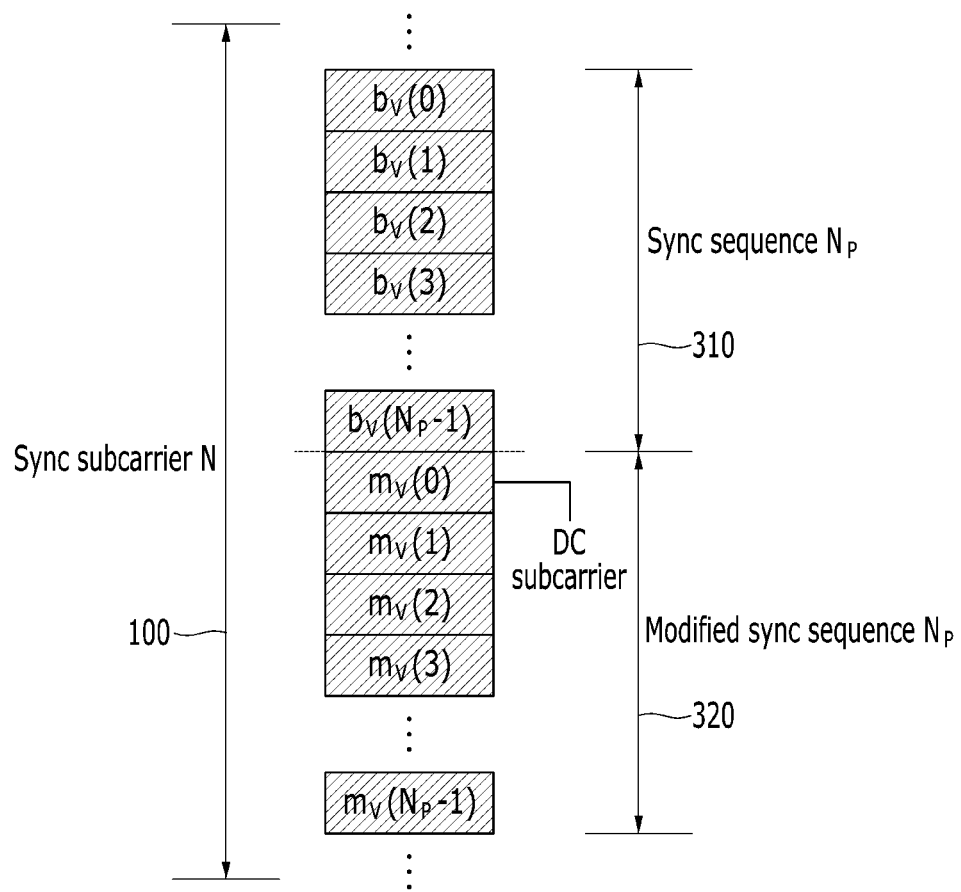
FIGS. 3 and 4 are conceptual diagrams illustrating a method of generating a sync signal in accordance with another exemplary embodiment of the present invention.
Figure 4:
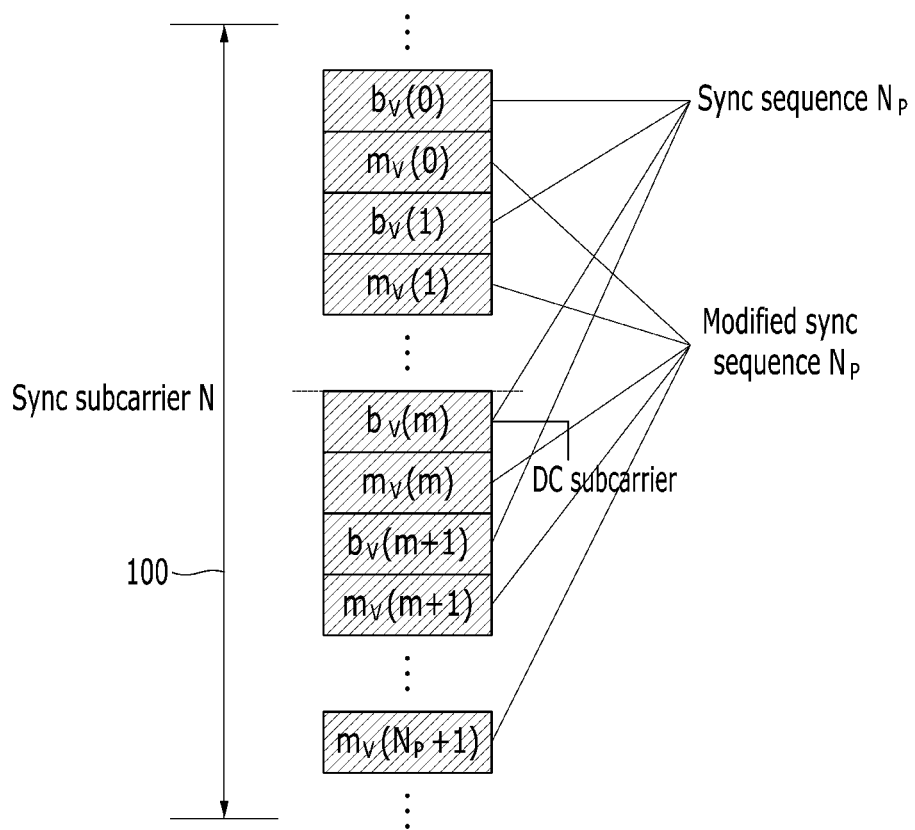

FIGS. 3 and 4 are conceptual diagrams illustrating a method of generating a sync signal in accordance with another exemplary embodiment of the present invention.

Referring to FIG. 3, first, a ZC sequence $b_v(k)$ having a length $N_P$ is allocated to an upper subcarrier group 310 of the sync subcarrier 100. The sequence $b_v(k)$ may be expressed by Equation 2.

$$b_V(k) = e^{-j\frac{\pi V k(k+1)}{N_P}}, k = 0, 1, \ldots, N_P - 1 \quad \text{(Equation 2)}$$

In Equation 2, V is the index of the sequence, and $N_P$ is the length of the sequence. In accordance with an exemplary embodiment of the present invention, the sync sequence according to Equation 2 may be defined as a base sequence.

Furthermore, a modified sync sequence $m_v(k)$ modified from the sequence $b_v(k)$ is allocated to a lower subcarrier group 320 of the sync subcarrier 100. The sequence $m_v(k)$ is expressed by Equation 3.

$$m_v(k-N_P) = \text{either of } (b_v(k-N_P))^*, -b_v(k-N_P), \text{ or } -(b_v(k-N_P))^* \text{ for } N_P \leq k \leq 2N_P - 1. \quad \text{(Equation 3)}$$

Figure 5:
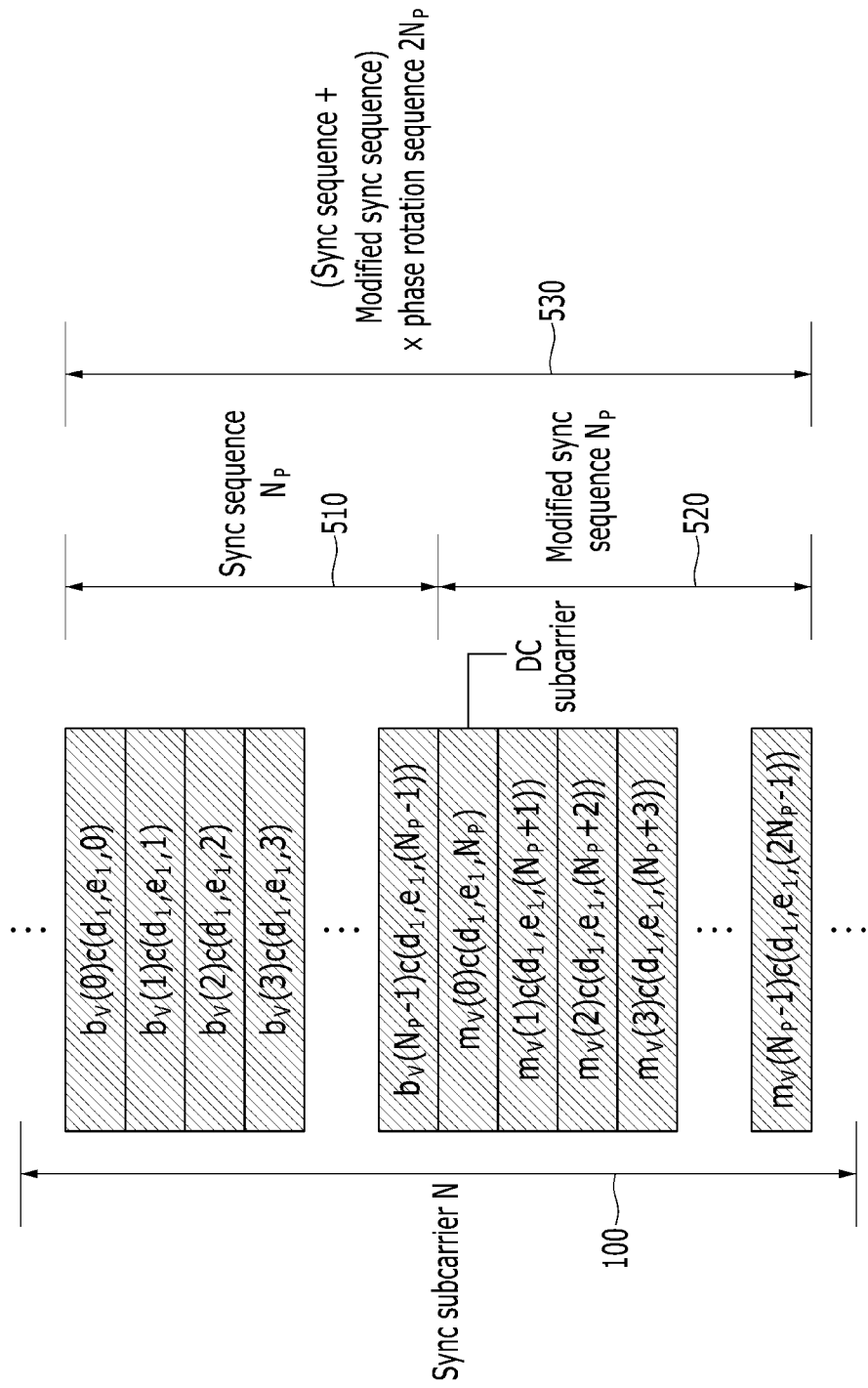
FIG. 5 is a conceptual diagram illustrating a method of generating a sync signal in accordance with another exemplary embodiment of the present invention.

In FIG. 4, $b_v(k)$ and $m_v(k)$ are alternately allocated to neighboring subcarriers. That is, $b_v(k)$ is allocated to even-numbered (or odd-numbered) subcarrier groups of the sync subcarrier 100, and $m_v(k)$ is allocated to odd-numbered (or even-numbered) subcarrier groups of the sync subcarrier 100. If a sync sequence is allocated to a subcarrier and a sync signal is transmitted using the methods illustrated in FIGS. 3 and 4, synchronization estimation can be robustly performed on a frequency offset. FIG. 5 is a conceptual diagram illustrating a method of generating a sync signal in accordance with another exemplary embodiment of the present invention.

In FIG. 5, different sync sequences are allocated to an upper subcarrier group 510 and a lower subcarrier group 520 of the sync subcarrier 100. In accordance with another exemplary embodiment of the present invention, a first sync sequence allocated to the upper subcarrier group 510 may be allocated to an even-numbered (or odd-numbered) subcarrier group as illustrated in FIG. 4. In this case, a second sync sequence allocated to the lower subcarrier group 520 may be allocated to an odd-numbered (or even-numbered) subcarrier group. Although not illustrated, sync sequences to be described later in accordance with another exemplary embodiment of the present invention may be allocated to an even-numbered subcarrier and an odd-numbered subcarrier in the same manner. A sync signal that is robust against a frequency offset can be generated because at least two different sync sequences are allocated to the sync subcarrier 100.

Referring to FIG. 5, first, the base sequence according to Equation 2 is allocated to the upper subcarrier group 510 of the sync subcarrier 100. An $m_v'(k)$ sequence, that is, the modified sync sequence of the base sequence, is allocated to the lower subcarrier group 520 of the sync subcarrier 100. The $m_v'(k)$ sequence is expressed by Equation 4.

$$m_v'(k) = \text{either of } b_v(k), (b_v(k))^*, -b_v(k), \text{ or } -(b_v(k))^* \text{ for } 0 \leq k \leq N_P - 1. \quad \text{(Equation 4)}$$

Thereafter, in order to reduce the PAPR of a received signal, the phases of the sequence elements (i.e., the elements of the sequences $b_v(k)$ and $m_v'(k)$) allocated to the respective subcarriers are controlled. In this case, phase rotation or phase shift (or cyclic shift) may be applied to a sequence element in accordance with an exemplary embodiment of the present invention. The application of the phase rotation or phase shift may be performed by multiplying the sequence element by a phase rotation sequence. The phase rotation sequence is expressed by Equation 5.

$$c(d,e,k) = \exp\{\pm j(d\pi k \pm e)\}. \quad \text{(Equation 5)}$$

In c(d,e,k) of Equation 5, d is a coefficient for controlling the rotation speed of a phase, and e is a coefficient indicative of the degree of the shift of the phase. That is, the phase rotation sequence includes a complex element expressed by d and e. The length of the phase rotation sequence according to Equation 5 is $2N_P$, which is the same as the sum of the length of the sequence $b_v(k)$ and the length of the sequence $m_v'(k)$. In FIG. 5, a sync signal $s_1(k)$ in the frequency domain may be expressed by Equation 6 below.

$$s_1(k) = \begin{cases} b_V(k)c(d_1, e_1, k), 0 \leq k \leq N_P - 1 \\ m_V(k - N_P)c(d_1, e_1, k), N_P \leq k \leq 2N_P - 1 \end{cases}$$ (Equation 6)

Figure 6:
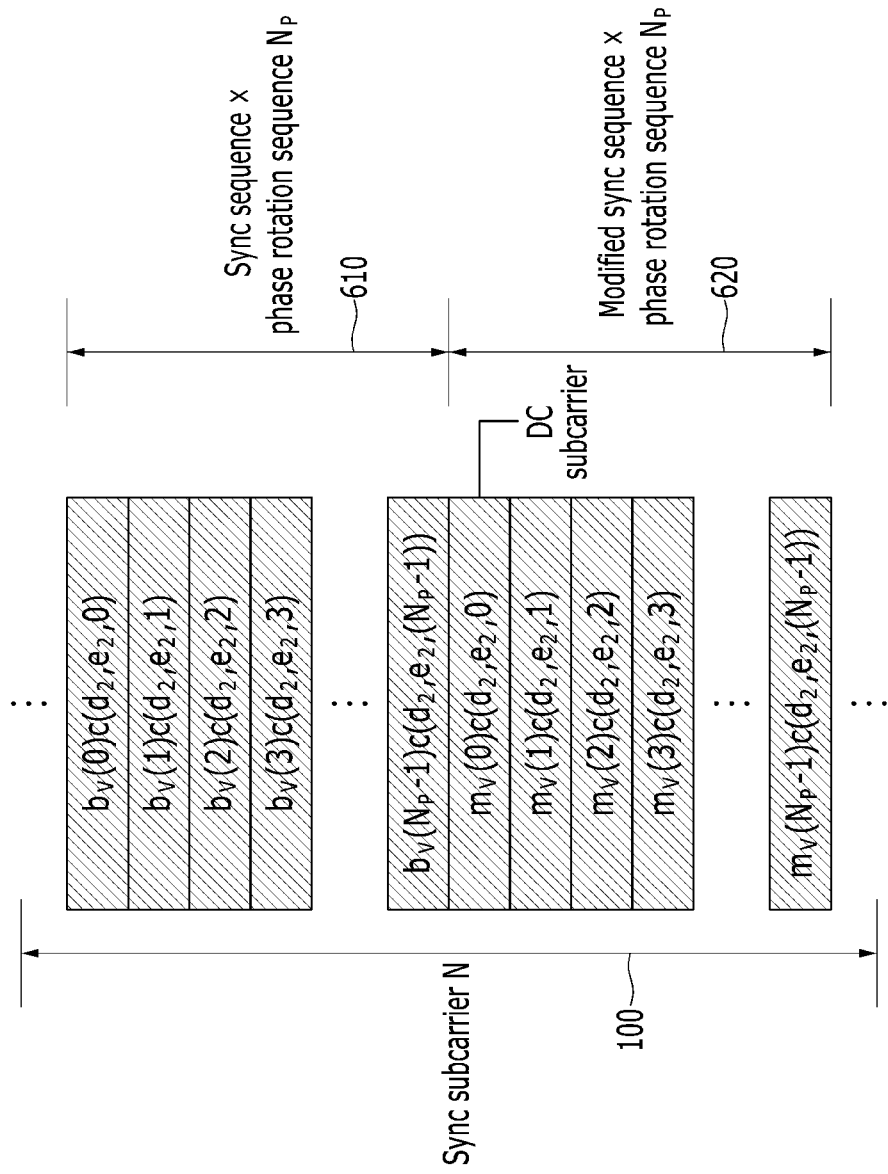
FIG. 6 is a conceptual diagram illustrating a method of generating a sync signal in accordance with another exemplary embodiment of the present invention.

FIG. 6 is a conceptual diagram illustrating a method of generating a sync signal in accordance with another exemplary embodiment of the present invention.

Referring to FIG. 6, the base sequence according to Equation 2 is allocated to an upper subcarrier group 610 of the sync subcarrier 100, and the modified sync sequence according to Equation 4 is allocated to a lower subcarrier group 620 of the sync subcarrier 100. Furthermore, in order to reduce the PAPR of a received signal, each of the base sequence and the modified sync sequence is multiplied by the same phase rotation sequence. In FIG. 6, the length of the phase rotation sequence is $N_P$, which is the same as the length of the sequence $b_v(k)$ or the length of the sequence $m_v'(k)$. In FIG. 6, a sync signal $s_2(k)$ in the frequency domain may be expressed by Equation 7 below.

$$s_2(k) = \begin{cases} b_V(k)c(d_2, e_2, k), 0 \leq k \leq N_P - 1 \\ m_V(k - N_P)c(d_2, e_2, (k - N_P)), N_P \leq k \leq 2N_P - 1 \end{cases}$$ (Equation 7)

Figure 7:
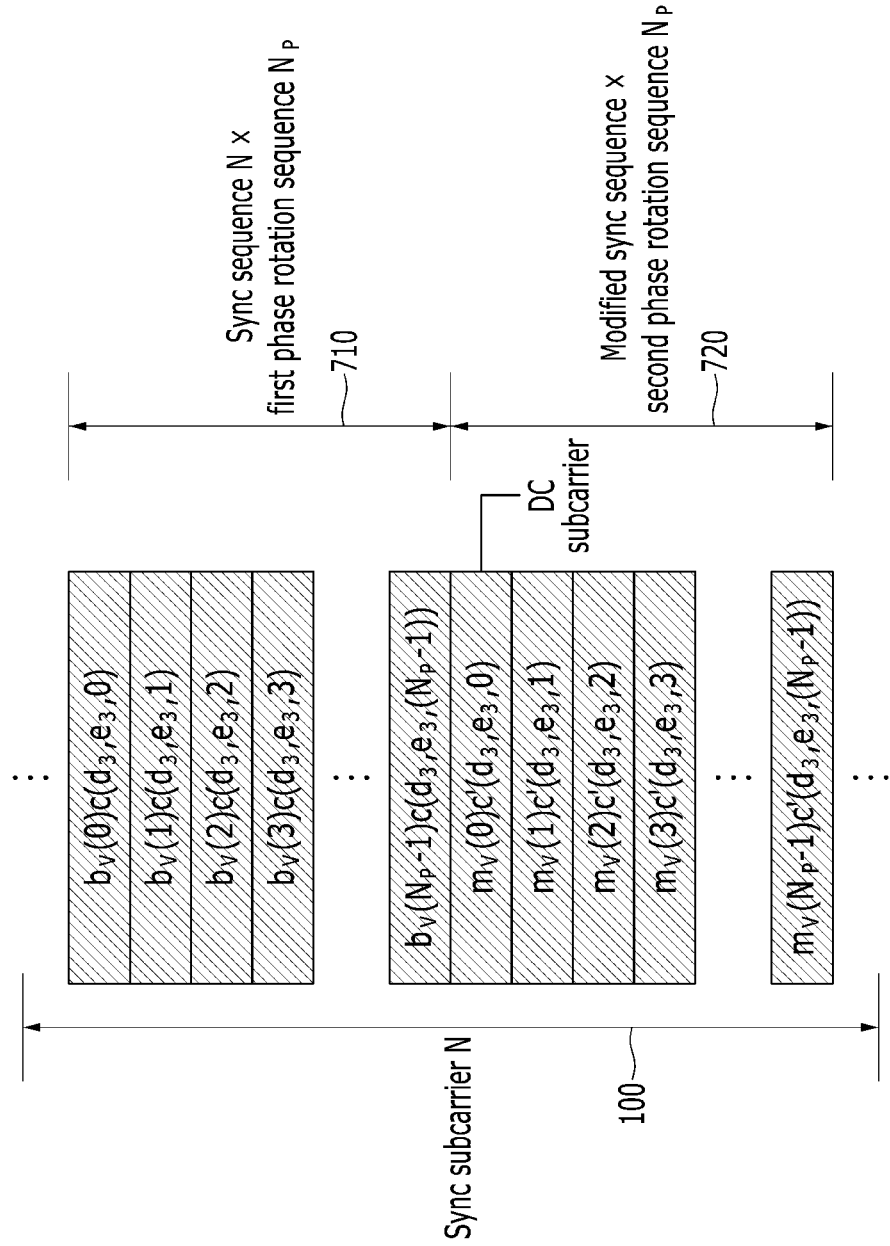
FIG. 7 is a conceptual diagram illustrating a method of generating a sync signal in accordance with another exemplary embodiment of the present invention.

FIG. 7 is a conceptual diagram illustrating a method of generating a sync signal in accordance with another exemplary embodiment of the present invention.

Referring to FIG. 7, the base sequence according to Equation 2 is allocated to an upper subcarrier group 710 of the sync subcarrier 100, and the modified sync sequence according to Equation 4 is allocated to a lower subcarrier group 720 of the sync subcarrier 100. Furthermore, in order to reduce the PAPR of a received signal, the base sequence and the modified sync sequence are multiplied by different phase rotation sequences. Referring to FIG. 7, in accordance with another exemplary embodiment of the present invention, the base sequence may be multiplied by the phase rotation sequence (i.e., a first phase rotation sequence) according to Equation 5, and the modified sync sequence may be multiplied by a phase rotation sequence (i.e., a second phase rotation sequence) that is different from the phase rotation sequence according to Equation 5. That is, the base sequence and the modified sync sequence may be multiplied by different phase rotation sequences. Equation 8 indicates the second phase rotation sequence c'(d,e,k).

$$c'(d,e,k) = \text{either of } c(d,e,k), (c(d,e,k))^*, -c(d,e,k), \text{ or } -(c(d,e,k))^* \text{ for } 0 \leq k \leq N_P - 1.$$ (Equation 8)

In accordance with another exemplary embodiment of the present invention, the phase rotation sequence c'(d,e,k) according to Equation 8 may be multiplied by the base sequence, and the modified sync sequence may be multiplied by the phase rotation sequence c(d,e,k) according to Equation 5. In FIG. 7, a sync signal $s_3(k)$ in the frequency domain may be expressed by Equation 9 below.

$$s_3(k) = \begin{cases} b_V(k)c(d_3, e_3, k), 0 \leq k \leq N_P - 1 \\ m_V(k - N_P)c'(d_3, e_3, (k - N_P)), N_P \leq k \leq 2N_P - 1 \end{cases}$$ (Equation 9)

Figure 8:
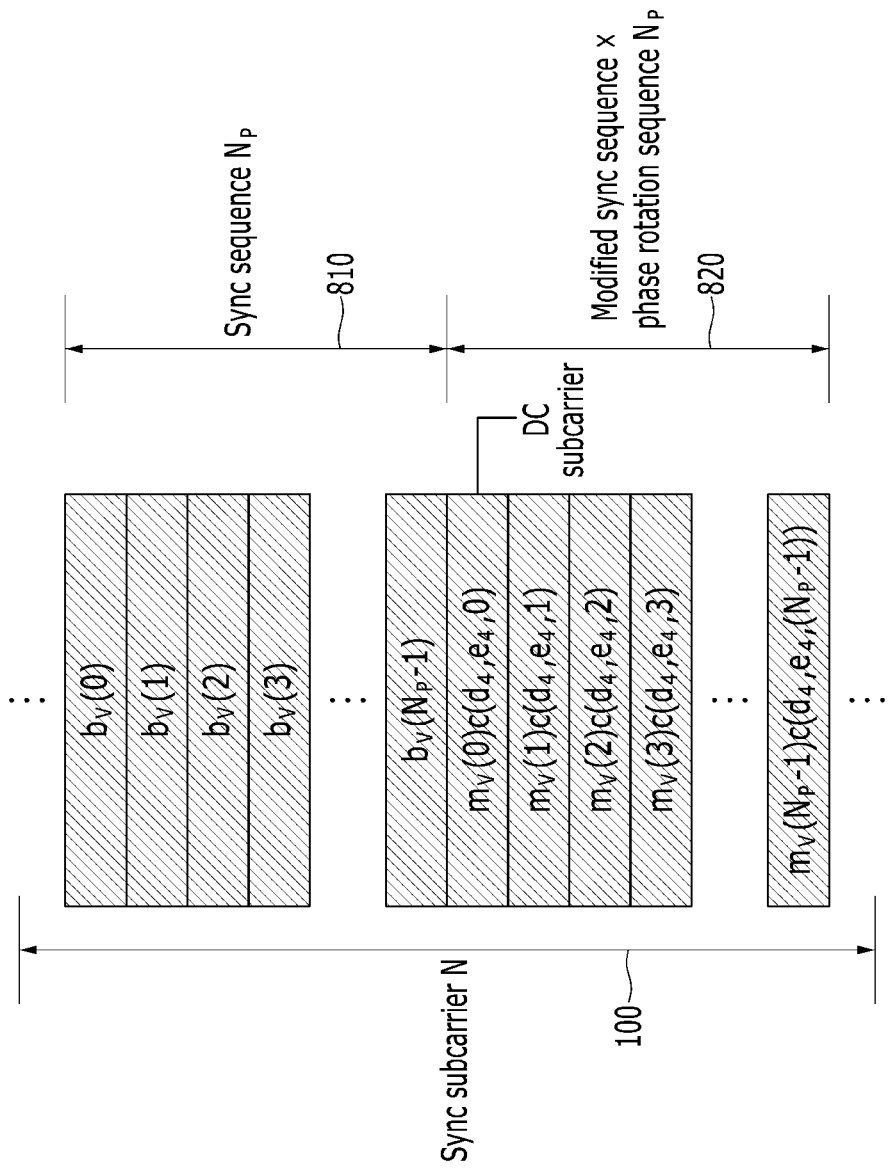
FIG. 8 is a conceptual diagram illustrating a method of generating a sync signal in accordance with another exemplary embodiment of the present invention.

FIG. 8 is a conceptual diagram illustrating a method of generating a sync signal in accordance with another exemplary embodiment of the present invention.

Referring to FIG. 8, the base sequence according to Equation 2 is allocated to an upper subcarrier group 810 of the sync subcarrier 100, and the modified sync sequence according to Equation 4 is allocated to a lower subcarrier group 820 of the sync subcarrier 100. Furthermore, in order to reduce the PAPR of the received signal, the modified sync sequence may be multiplied by a phase rotation sequence. In this case, a multiplication operation is not added to the base sequence, but only the modified sync sequence may be multiplied by the phase rotation sequence. In FIG. 8, a sync signal $s_4(k)$ in the frequency domain may be expressed by Equation 10 below.

$$s_4(k) = \begin{cases} b_V(k), 0 \leq k \leq N_P - 1 \\ m_V(k - N_P)c(d_4, e_4, (k - N_P)), N_P \leq k \leq 2N_P - 1 \end{cases}$$ (Equation 10)

A method of generating a system signal, control signal, or data signal (hereinafter referred to as an "information signal") capable of reducing the PAPR while obtaining a diversity gain is described with reference to FIGS. 9 to 12. Frequency resources used to send the information signal have been illustrated as being divided into two, but the frequency resources may be divided by an integer greater than 2 and the information signal may be generated.

Figure 9:
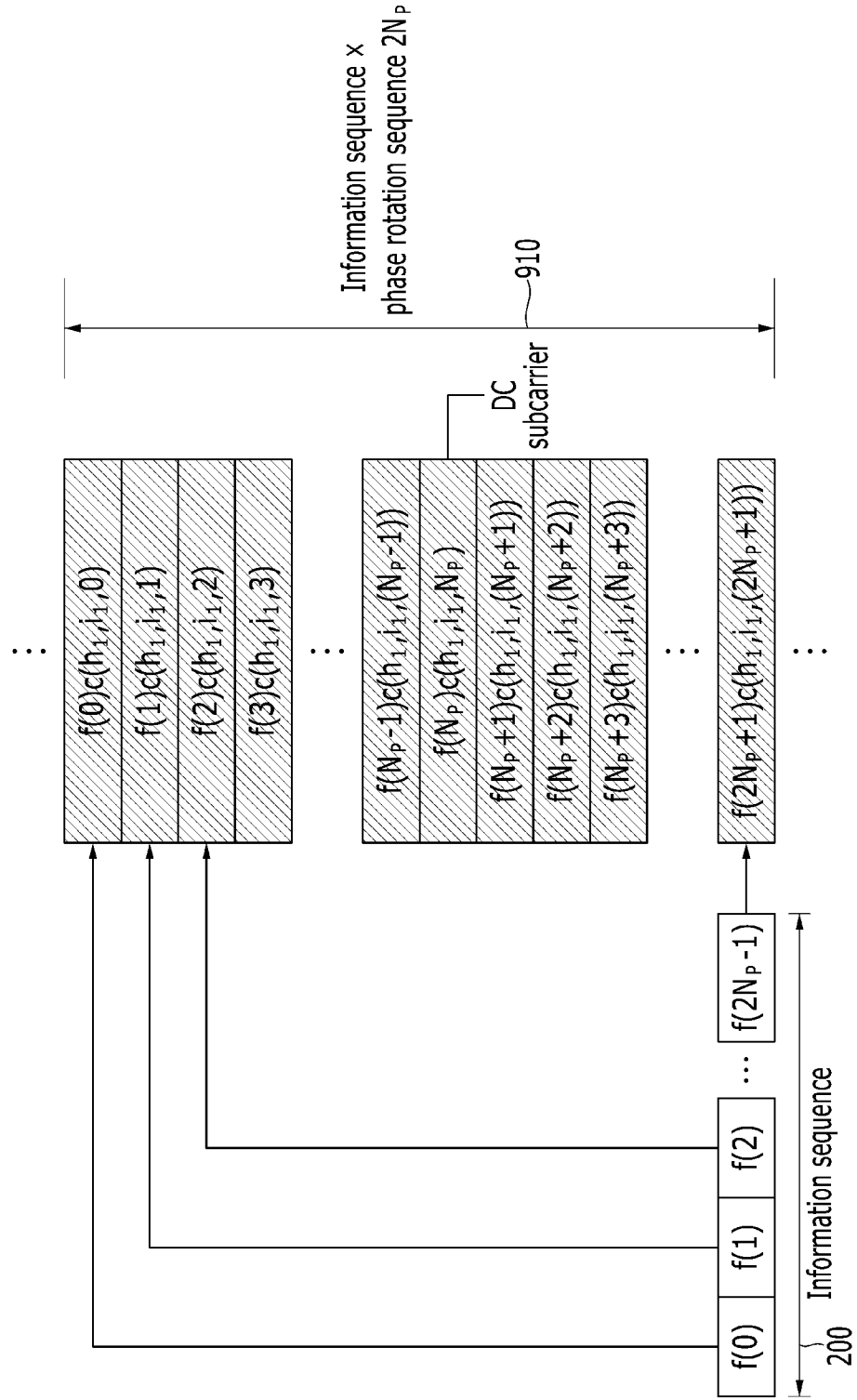
FIG. 9 is a conceptual diagram illustrating a method of generating an information signal in accordance with an exemplary embodiment of the present invention.

FIG. 9 is a conceptual diagram illustrating a method of generating an information signal in accordance with an exemplary embodiment of the present invention.

Referring to FIG. 9, an information sequence f(k) ($0 \leq k \leq 2N_P - 1$, 200) is allocated to subcarriers used to send an information signal. In this case, the information sequence 200 has a length of $2N_P$. Furthermore, the information signal may be generated by multiplying the information sequence 200 by the phase rotation sequence according to Equation 5. In FIG. 9, the information signal $x_1(k)$ in the frequency domain may be expressed by Equation 11.

$$x_1(k) = f(k)c(h_1, i_1, k), 0 \leq k \leq 2N_P - 1.$$ (Equation 11)

Figure 10:
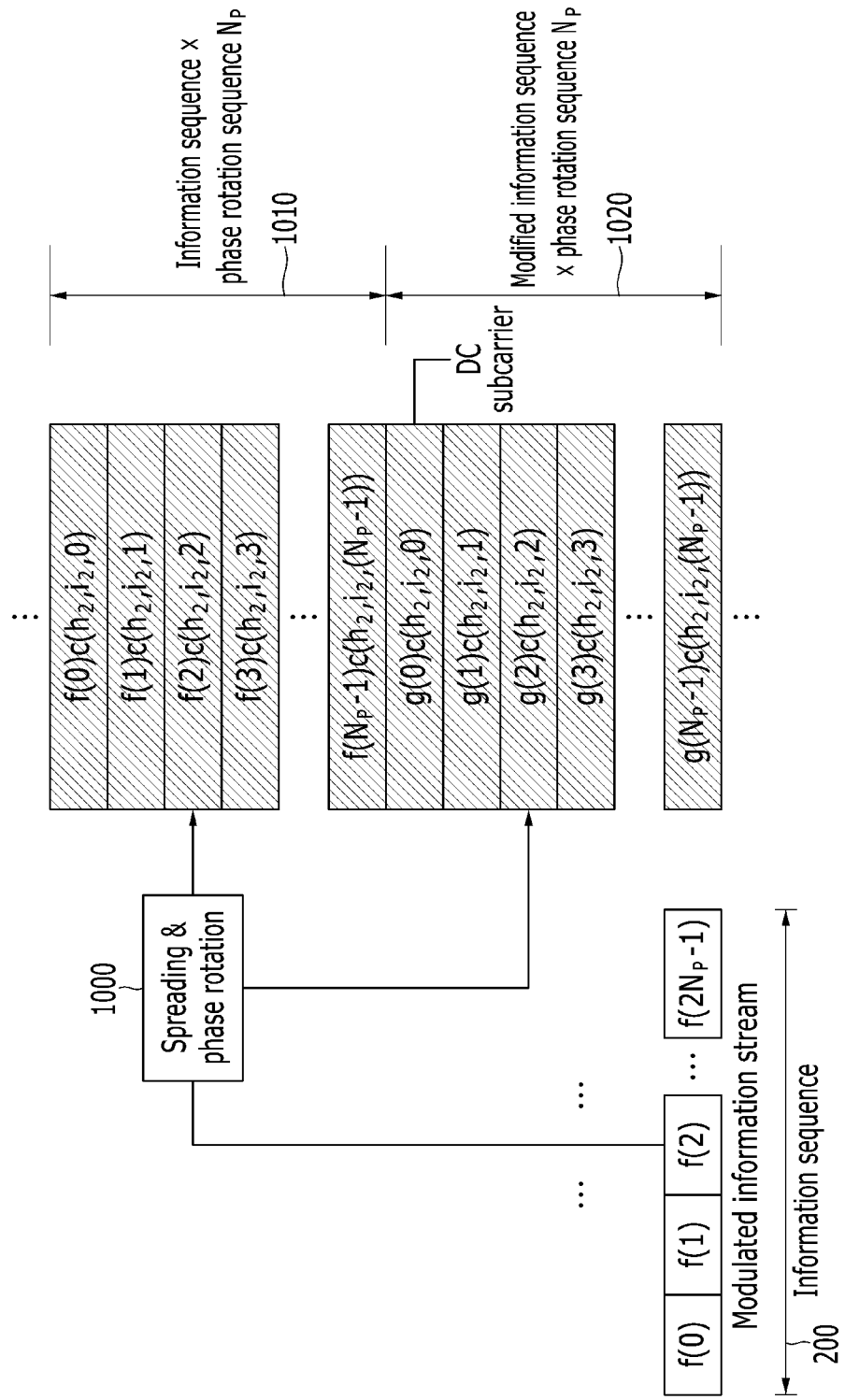
FIG. 10 is a conceptual diagram illustrating a method of generating an information signal in accordance with another exemplary embodiment of the present invention.

FIG. 10 is a conceptual diagram illustrating a method of generating an information signal in accordance with another exemplary embodiment of the present invention.

Referring to FIG. 10, an information sequence f(k) ($0 \leq k \leq N_P - 1$) is allocated to an upper subcarrier group 1010 that belongs to subcarriers used to send an information signal, and a modified information sequence g(k) of the information sequence f(k) is allocated to a lower subcarrier group 1020 that belongs to the subcarriers. If the information sequence and the modified information sequence of the information sequence are respectively allocated to the upper subcarrier group 1010 and the lower subcarrier group 1020 as described above, a diversity gain can be expected because the spreading effect of the sequence can be obtained. In this case, the modified information sequence may be expressed by Equation 12 below.

$$g(k) = \text{either of } f(k), (f(k))^*, -f(k), \text{ or } -(f(k))^* \text{ for } 0 \leq k \leq N_P - 1.$$ (Equation 12)

Thereafter, the information signal in the frequency domain may be generated by multiplying the information sequence and the modified information sequence by the phase rotation sequence according to Equation 5. In this case, the information sequence and the modified information sequence may be multiplied by the same phase rotation sequence. The length of the phase rotation sequence is $N_P$, which is the same as the length of the sequence f(k) or the length of the sequence g(k). In FIG. 10, the information signal $x_2(k)$ in the frequency domain may be expressed by Equation 13.

$$x_2(k) = \begin{cases} f(k)c(h_2, i_2, k), 0 \le k \le N_P - 1 \\ g(k - N_P)c(h_2, i_2, (k - N_P)), N_P \le k \le 2N_P - 1 \end{cases}$$ (Equation 13)

Figure 11:
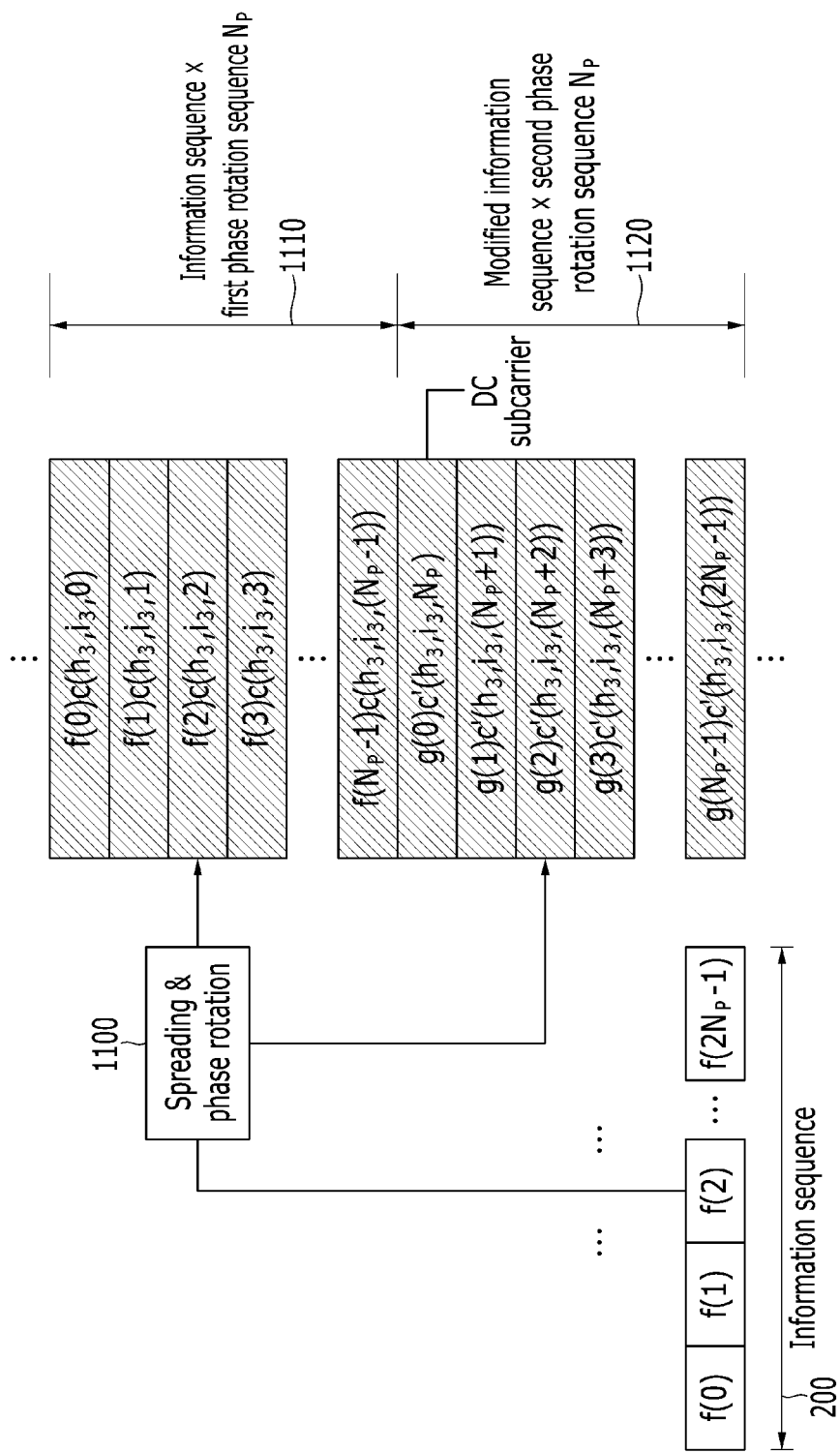
FIG. 11 is a conceptual diagram illustrating a method of generating an information signal in accordance with another exemplary embodiment of the present invention.

FIG. 11 is a conceptual diagram illustrating a method of generating an information signal in accordance with another exemplary embodiment of the present invention.

Referring to FIG. 11, an information sequence f(k) (0≤k≤$N_P$−1) is allocated to an upper subcarrier group 1110 that belongs to subcarriers used to send an information signal, and a modified information sequence g(k) (0≤k≤$N_P$−1) is allocated to a lower subcarrier group 1120 that belongs to the subcarriers. In this case, the modified information sequence g(k) may be the sequence according to Equation 12. Thereafter, the information signal may be generated by multiplying the information sequence and the modified information sequence by the phase rotation sequence according to Equation 5. In this case, the length of the phase rotation sequence is 2NP, which is the same as the sum of the length of the sequence f(k) and the length of the sequence g(k). In FIG. 11, the information signal x3(k) in the frequency domain may be expressed by Equation 14.

$$x_3(k) = \begin{cases} f(k)c(h_3, i_3, k), 0 \le k \le N_P - 1 \\ g(k - N_P)c'(h_3, i_3, (k - N_P)), N_P \le k \le 2N_P - 1 \end{cases}$$ (Equation 14)

Figure 12:
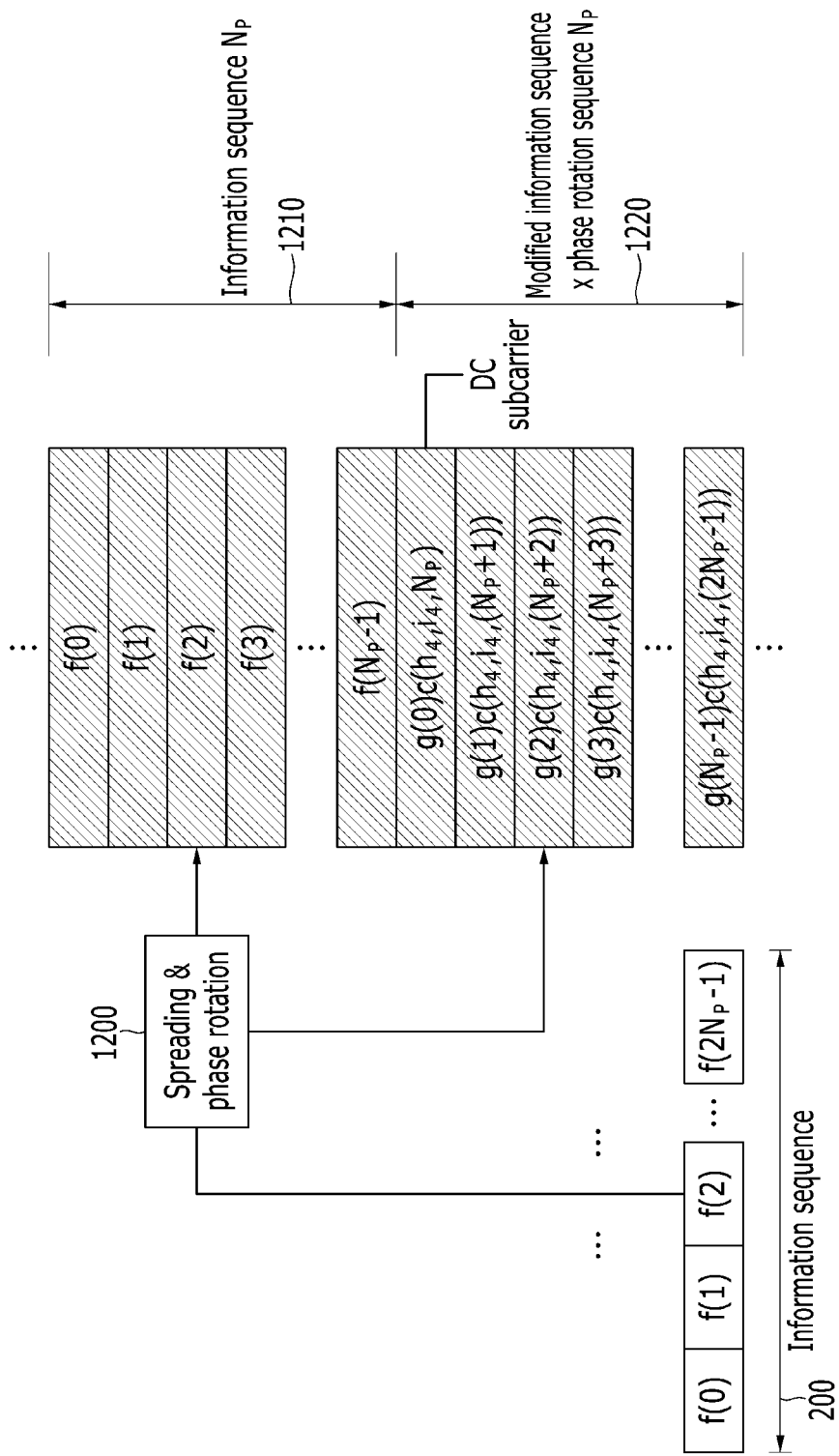
FIG. 12 is a conceptual diagram illustrating a method of generating an information signal in accordance with another exemplary embodiment of the present invention.

FIG. 12 is a conceptual diagram illustrating a method of generating an information signal in accordance with another exemplary embodiment of the present invention.

Referring to FIG. 12, an information sequence f(k) (0≤k≤$N_P$−1) is allocated to an upper subcarrier group 1210 that belongs to subcarriers used to send an information signal, and a modified information sequence g(k) (0≤k≤$N_P$−1) is allocated to a lower subcarrier group 1220 that belongs to the subcarriers. In this case, the modified information sequence g(k) may be the sequence according to Equation 12. Thereafter, the information signal may be generated by multiplying the modified information sequence by the phase rotation sequence according to Equation 5. In this case, the sequence f(k) allocated to the upper subcarrier group 1210 is not multiplied by the phase rotation sequence, but only the sequence g(k) allocated to the lower subcarrier group 1220 may be multiplied by the phase rotation sequence. In FIG. 12, the sync signal x4(k) in the frequency domain may be expressed by Equation 15 below.

$$x_4(k) = \begin{cases} f(k), 0 \le k \le N_P - 1 \\ g(k - N_P)c(h_4, i_4, (k - N_P)), N_P \le k \le 2N_P - 1 \end{cases}$$ (Equation 15)

Figure 13:
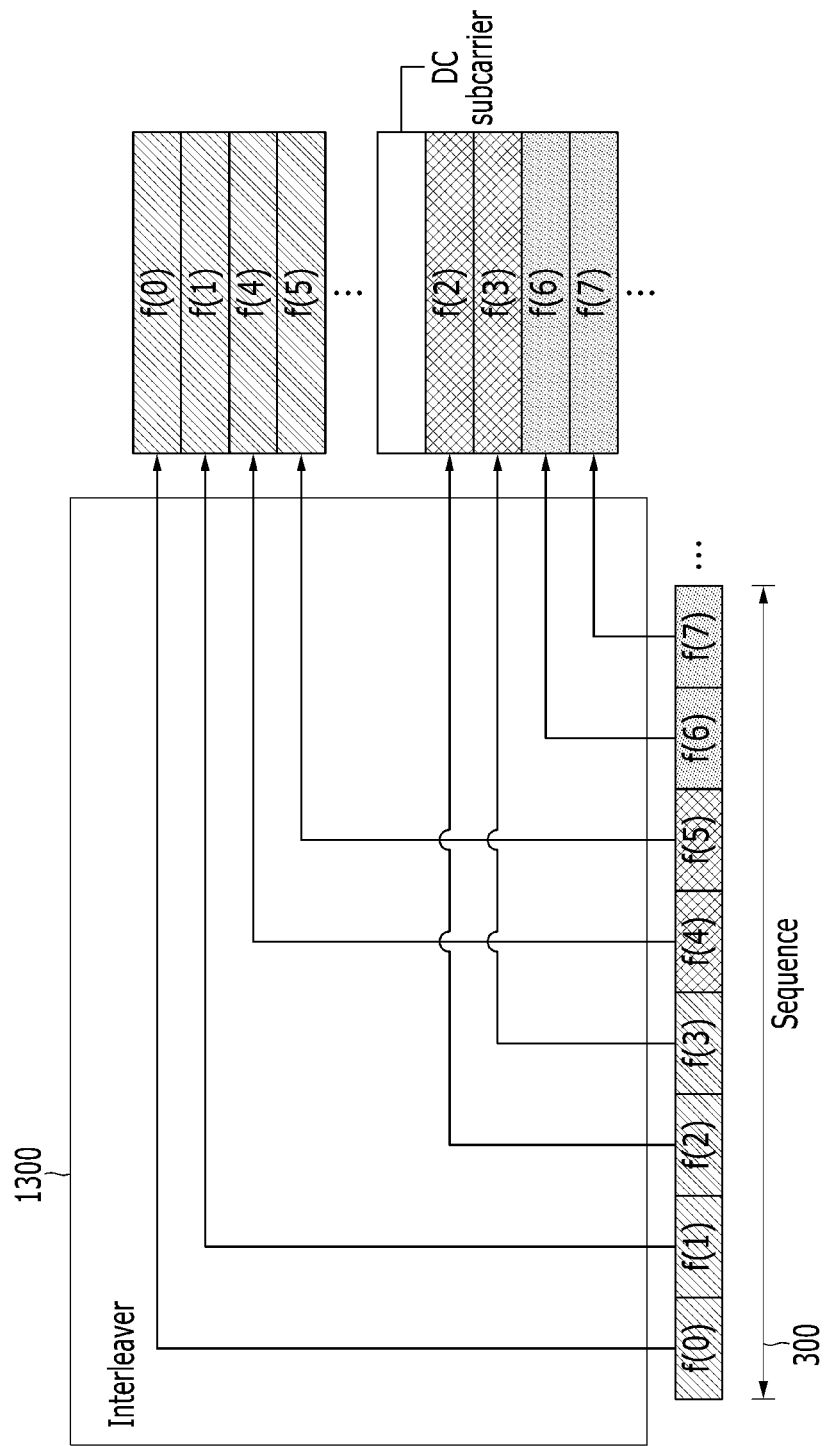
FIG. 13 is a conceptual diagram illustrating a method of allocating a sequence to subcarriers in accordance with an exemplary embodiment of the present invention.

FIG. 13 is a conceptual diagram illustrating a method of allocating a sequence to subcarriers in accordance with an exemplary embodiment of the present invention.

Referring to FIG. 13, an interleaver 1300 groups a modulated sequence 300 every M bits (M≥2). In FIG. 13 in accordance with an exemplary embodiment of the present invention, the sequence 300 has been illustrated as being grouped every two bits for simplicity of the drawing. Furthermore, the interleaver 1300 sequentially alternately allocates the grouped bit groups to the upper subcarrier group and the lower subcarrier group. Referring to FIG. 13, f(0) and f(1) are allocated to the upper subcarrier group, f(2) and f(3) are allocated to the lower subcarrier group, f(4) and f(5) are allocated to the upper subcarrier group again, and f(6) and f(7) are allocated to the lower subcarrier group again. If the sequence 300 is allocated to subcarriers through interleaving as illustrated in FIG. 13, a burst error on the receiver side can be prevented.

Figure 14:
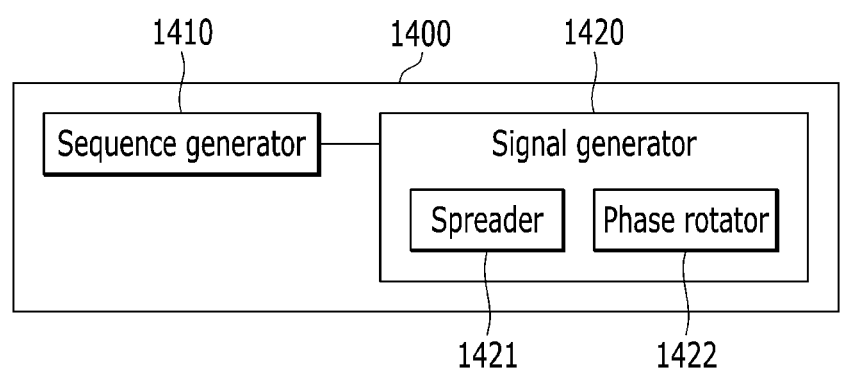
FIG. 14 is a diagram illustrating an apparatus for generating a signal in accordance with an exemplary embodiment of the present invention.

FIG. 14 is a diagram illustrating an apparatus for generating a signal in accordance with an exemplary embodiment of the present invention.

Referring to FIG. 14, an apparatus 1400 for generating a signal in accordance with an exemplary embodiment of the present invention includes a sequence generator 1410 and a signal generator 1420.

The sequence generator 1410 may generate a sync sequence or information sequence in accordance with an exemplary embodiment of the present invention. Furthermore, the sequence generator 1410 may generate a phase rotation sequence in accordance with an exemplary embodiment of the present invention. In this case, the information sequence is a sequence regarding system information, control information, or data information.

The signal generator 1420 may implement the method of generating a signal in accordance with an exemplary embodiment of the present invention. That is, the signal generator 1420 in accordance with an exemplary embodiment of the present invention may allocate a sync sequence or information sequence to subcarriers, and generate a signal in a frequency domain by multiplying the sync sequence or information sequence by a phase rotation sequence. That is, the signal generator 1420 may generate a signal by multiplying a plurality of elements included in a sequence and a plurality of elements included in a phase rotation sequence for each sequence index. The signal generator 1420 may divide a sync sequence or information sequence and allocate them to M subcarrier groups that belong to all the subscarriers used to send the sync signal or information signal.

In accordance with an exemplary embodiment of the present invention, the signal generator 1420 may include a spreader 1421 and a phase rotator 1422.

The spreader 1421 may divide a sync sequence or information sequence and allocate them to at least one subcarrier group. If the spreader 1421 divides a sequence and allocates them to a first subcarrier group and a second subcarrier group, the first subcarrier group may include subcarriers Nos. 0 to N−1 of all the 2N subcarriers, and the second subcarrier group may include subcarriers Nos. N to 2N−1 of all the 2N subcarriers. Alternatively, the first subcarrier group may include even-numbered subcarriers of all the 2N subcarriers, and the second subcarrier group may include odd-numbered subcarriers of all the 2N subcarriers.

The phase rotator 1422 may process a mathematical operation between a sync sequence or information sequence and a phase rotation sequence. In accordance with an exemplary embodiment of the present invention, the phase rotator 1422 may generate a sync signal or information signal by multiplying a sync sequence or information sequence by a phase rotation sequence.

Figure 15:
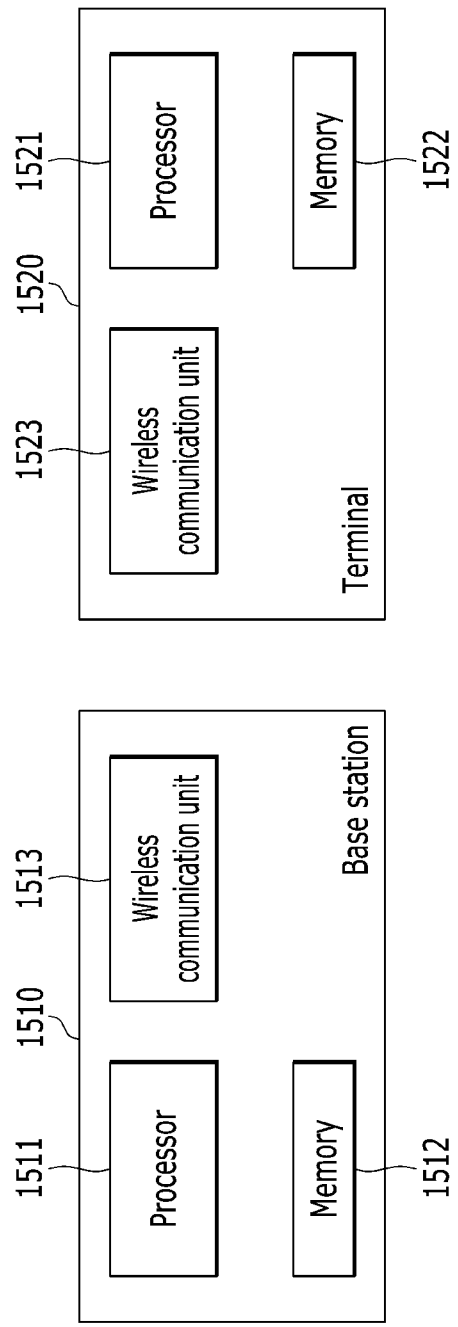
FIG. 15 is a block diagram illustrating a wireless communication system in accordance with an exemplary embodiment of the present invention.

FIG. 15 is a block diagram illustrating a wireless communication system in accordance with an exemplary embodiment of the present invention.

The wireless communication system in accordance with an exemplary embodiment of the present invention includes a base station 1510 and a terminal 1520. The sequence generator 1410 and the signal generator 1420 are included in the base station 1510 or the terminal 1520.

The base station 1510 in accordance with an exemplary embodiment of the present invention includes at least one processor 1511, memory 1512, and radio frequency (RF) unit 1513. The memory 1512 is connected to the processor 1511, and may store a variety of types of information for driving the processor 1511. The wireless communication unit 1513 is connected to the processor 1511, and may send/receive a wireless signal generated by the processor 1511. The processor 1511 may implement the functions, processes, or methods proposed in accordance with an exemplary embodiment of the present invention. In this case, in the wireless communication system in accordance with an exemplary embodiment of the present invention, a wireless interface protocol layer may be implemented by the processor 1511. The operation of the base station 1510 in accordance with an exemplary embodiment of the present invention may be implemented by the processor 1511.

The terminal 1520 in accordance with an exemplary embodiment of the present invention includes at least one processor 1521, memory 1522, and radio frequency (RF) unit 1523. The memory 1522 is connected to the processor 1521, and may store a variety of types of information for driving the processor 1521. The wireless communication unit 1523 is connected to the processor 1521, and may send/receive a wireless signal generated by the processor 1521. The processor 1521 may implement the functions, processes, or methods proposed in accordance with an exemplary embodiment of the present invention. In this case, in the wireless communication system in accordance with an exemplary embodiment of the present invention, a wireless interface protocol layer may be implemented by the processor 1521. The operation of the terminal 1520 in accordance with an exemplary embodiment of the present invention may be implemented by the processor 1521.

In accordance with an exemplary embodiment of the present invention, the memory may be placed inside or outside the processor. The memory may be connected to the processor through various well-known means. The memory may be a variety of types of volatile or non-volatile media. For example, the memory may include a read-only memory (ROM) or random access memory (RAM).

As described above, in accordance with an exemplary embodiment of the present invention, a sync signal that is robust against a frequency offset and is capable of reducing the PAPR can be generated using a phase rotation sequence. Furthermore, an information signal having excellent demodulation performance and that is capable of reducing the PAPR can be generated through a diversity gain.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of generating a signal in a wireless communication system, the method comprising:
   allocating a sequence to a plurality of subcarriers for sending the signal by a spreader; and
   sending the signal based on the sequence and a phase rotation sequence by a phase rotator,
   wherein allocating the sequence comprises:
      allocating the sequence to a first subcarrier group that belongs to the plurality of subcarriers by the spreader; and
      allocating a modified sequence of the sequence to a second subcarrier group that belongs to the plurality of subcarriers by the spreader.

2. The method of claim 1, wherein the first subcarrier group comprises even-numbered subcarriers of the plurality of subcarriers, and the second subcarrier group comprises odd-numbered subcarriers of the plurality of subcarriers.

3. The method of claim 1, wherein generating the signal comprises respectively multiplying elements of the sequence and elements of the phase rotation sequence together by the phase rotator.

4. The method of claim 3, wherein:
   respectively multiplying the elements of the sequence and the elements of the phase rotation sequence together comprises multiplying the elements of the sequence and elements of the modified sequence of the sequence by the elements of the phase rotation sequence;
   there are N elements of the sequence and N elements of the modified sequence; and
   there are 2N elements of the phase rotation sequence.

5. The method of claim 3, wherein:
   respectively multiplying the elements of the sequence and the elements of the phase rotation sequence together comprises respectively multiplying the elements of the sequence and elements of the modified sequence of the sequence by the elements of the phase rotation sequence; and
   there are N elements of the sequence, N elements of the modified sequence, and N elements of the phase rotation sequence.

6. The method of claim 3, wherein:
   the phase rotation sequence comprises a first phase rotation sequence and a second phase rotation sequence different from the first phase rotation sequence;
   respectively multiplying the elements of the sequence and the elements of the phase rotation sequence together comprises multiplying the elements of the sequence and elements of the first phase rotation sequence together and multiplying elements of the modified sequence of the sequence and elements of the second phase rotation sequence together; and
   a number of the elements of the sequence, there are N elements of the modified sequence, N elements of the first phase rotation sequence, and N elements of the second phase rotation sequence.

7. The method of claim 1, wherein the sequence comprises a sync sequence.

8. The method of claim 1, wherein the sequence comprises an information sequence, and the information sequence comprises a sequence regarding any one of system information, control information, and data information of the wireless communication system.

9. The method of claim 1, wherein the phase rotation sequence comprises a complex element expressed by a coefficient for controlling rotation speed of a phase and a coefficient indicative of a degree of shift of the phase.

10. An apparatus for generating a signal in a wireless communication system, the apparatus comprising:
    a spreader configured to allocate a sequence to a plurality of subcarriers for sending the signal; and
    a phase rotator configured to generate the signal based on the sequence and a phase rotation sequence,
    wherein the spreader allocates the sequence to a first subcarrier group that belongs to the plurality of subcarriers, and allocates a modified sequence of the sequence to a second subcarrier group that belongs to the plurality of subcarriers.

11. The apparatus of claim 10, wherein the first subcarrier group comprises even-numbered subcarriers of the plurality of subcarriers, and the second subcarrier group comprises odd-numbered subcarriers of the plurality of subcarriers.

12. The apparatus of claim 10, wherein the phase rotator respectively multiplies elements of the sequence and elements of the phase rotation sequence together.

13. The apparatus of claim 12, wherein the phase rotator multiplies the elements of the sequence and elements of the modified sequence of the sequence by the elements of the phase rotation sequence, there are N elements of the sequence and N elements of the modified sequence, and there are 2N elements of the phase rotation sequence.

14. The apparatus of claim 12, wherein the phase rotator respectively multiplies the elements of the sequence and elements of the modified sequence of the sequence by the elements of the phase rotation sequence, and there are N elements of the sequence, N elements of the modified sequence, and N elements of the phase rotation sequence.

15. The apparatus of claim 12, wherein:
the phase rotation sequence comprises a first phase rotation sequence and a second phase rotation sequence different from the first phase rotation sequence;
respectively multiplying the elements of the sequence and the elements of the phase rotation sequence together comprises multiplying the elements of the sequence and elements of the first phase rotation sequence together and multiplying elements of the modified sequence of the sequence and elements of the second phase rotation sequence together; and
there are N elements of the sequence, N elements of the modified sequence, N elements of the first phase rotation sequence, and N elements of the second phase rotation sequence.

16. The apparatus of claim 10, wherein the sequence comprises a sync sequence.

17. The apparatus of claim 10, wherein the sequence comprises an information sequence, and the information sequence comprises a sequence regarding any one of system information, control information, and data information of the wireless communication system.

18. The apparatus of claim 10, wherein the phase rotation sequence comprises a complex element expressed by a coefficient for controlling rotation speed of a phase and a coefficient indicative of a degree of shift of the phase.

* * * * *